(12) United States Patent
Pihan et al.

(10) Patent No.: US 10,125,430 B2
(45) Date of Patent: Nov. 13, 2018

(54) METHOD FOR MANUFACTURING A SILICON CYLINDER BY GROWTH ON SEEDS IN A DIRECTED SOLIDIFICATION FURNACE

(71) Applicant: COMMISSARIAT A L'ENERGIE ATOMIQUE ET AUX ENERGIES ALTERNATIVES, Paris (FR)

(72) Inventors: Etienne Pihan, La Motte Servolex (FR); Vanessa Amaral De Oliveira, Villeurbanne (FR); Denis Camel, Chambery (FR); Denis Chavrier, Chambery (FR); Gautier Fortin, Saint-Baldoph (FR); Anis Jouini, Chambery (FR); Benoit Marie, Aix-les-Bains (FR); Nelly Plassat, La Motte Servolex (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 223 days.

(21) Appl. No.: 14/894,385

(22) PCT Filed: May 26, 2014

(86) PCT No.: PCT/IB2014/061722
§ 371 (c)(1),
(2) Date: Nov. 27, 2015

(87) PCT Pub. No.: WO2014/191899
PCT Pub. Date: Dec. 4, 2014

(65) Prior Publication Data
US 2016/0108548 A1 Apr. 21, 2016

(30) Foreign Application Priority Data
May 27, 2013 (FR) ..................... 13 54759

(51) Int. Cl.
*C30B 11/14* (2006.01)
*B28D 5/04* (2006.01)
(Continued)

(52) U.S. Cl.
CPC ............... *C30B 11/14* (2013.01); *B28D 5/00* (2013.01); *B28D 5/04* (2013.01); *B28D 5/045* (2013.01);
(Continued)

(58) Field of Classification Search
CPC ....... C30B 11/002; C30B 11/14; C30B 15/00; C30B 29/06; B28D 5/04; B28D 5/045
(Continued)

(56) References Cited

U.S. PATENT DOCUMENTS

| | | | |
|---|---|---|---|
| 2001/0020437 A1* | 9/2001 | Falster | C30B 15/00 117/13 |
| 2009/0047203 A1* | 2/2009 | Mueller | C30B 11/14 423/348 |
| 2013/0233239 A1* | 9/2013 | Oriwol | C30B 11/02 117/81 |

FOREIGN PATENT DOCUMENTS

CN 102268724 A 12/2011
DE 102011075093 A1 11/2012
(Continued)

OTHER PUBLICATIONS

Kutsukake, Kentaro et al., "Control of Grain Boundary Propagation in Mono-Like Si: Utilization of Functional Grain Boundaries," Applied Physics Express, vol. 6, (2013); pp. 025502-1-025502-3.
(Continued)

*Primary Examiner* — Eileen Morgan
(74) *Attorney, Agent, or Firm* — Oliff PLC

(57) ABSTRACT

A method for manufacturing a silicon cylinder by growth on seeds in a directed solidification furnace, including at least
(Continued)

the following steps: (i) providing a crucible having a longitudinal axis (Z), in which the bottom is covered with a layer of seeds of monocrystalline silicon in a right prism shape; and (ii) proceeding with directed solidification of silicon by growth on seeds, in a direction of growth that is co-linear with the axis (Z) and with a concave solidification front, spatially or temporally; characterized in that the layer in step (i) of: one or more central seeds $G_c$; and one or more peripheral seeds $G_p$ contiguous to the seed(s) $G_c$, the peripheral seeds $G_p$ having a specific size.

17 Claims, 7 Drawing Sheets

(51) Int. Cl.
*C30B 15/00* (2006.01)
*C30B 29/06* (2006.01)
*B28D 5/00* (2006.01)
*C30B 11/00* (2006.01)
*C30B 11/02* (2006.01)

(52) U.S. Cl.
CPC ............ *C30B 11/002* (2013.01); *C30B 11/02* (2013.01); *C30B 15/00* (2013.01); *C30B 29/06* (2013.01)

(58) Field of Classification Search
USPC .......................................................... 125/12
See application file for complete search history.

(56) References Cited

FOREIGN PATENT DOCUMENTS

| | | |
|---|---|---|
| DE | 102011086669 A1 | 5/2013 |
| DE | 102012102597 A1 | 9/2013 |
| EP | 1209259 A2 * | 5/2002 ............. C30B 15/00 |
| WO | 2009/014957 A2 | 1/2009 |

OTHER PUBLICATIONS

Kutsukake, Kentaro et al., "Influence of structural imperfection of sigma5 grain boundaries in bulk multicrystalline Si on their electrical activities," Journal of Applied Physics, vol. 101, No. 6, Mar. 19, 2007, pp. 63509-063509.

Takahashi, Isao et al., "Generation mechanism of dislocations during directional solidification of multicrystalline silicon using srtificially designed seed," Journal of Crystal Growth, vol. 312, No. 7, Mar. 15, 2010, pp. 897-901.

Fujiwara, Kozo et al., "Growth of structure-controlled polycrystalline silicon ingots for solar cells by casting," Elsevier, Institute for Materials Research, vol. 54, (2006); pp. 3191-3197.

Jul. 7, 2014 Search Report issued in International Patent Application No. PCT/IB2014/061722.

* cited by examiner

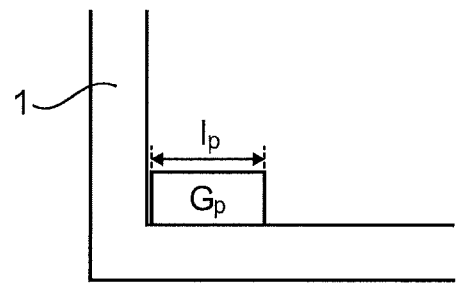 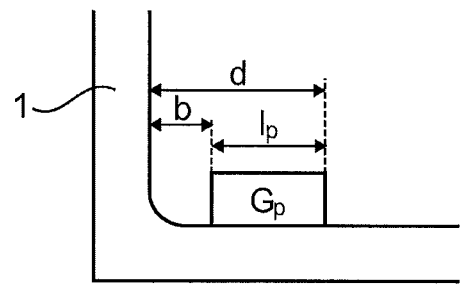
Fig. 4a        Fig. 4b
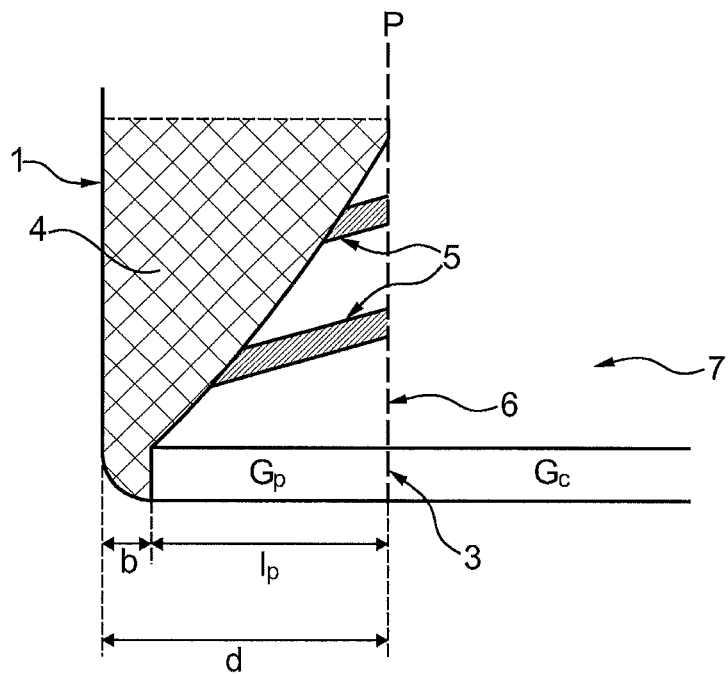
Fig. 5

METHOD FOR MANUFACTURING A SILICON CYLINDER BY GROWTH ON SEEDS IN A DIRECTED SOLIDIFICATION FURNACE

The present invention relates to a novel process for manufacturing a silicon ingot, having an increased proportion of monocrystalline zone, advantageously poor in crystalline defects, especially in twinned crystals.

Such a monocrystalline zone may be advantageously dedicated to giving, by cutting, monocrystalline silicon wafers of excellent crystalline quality. Such wafers are particularly advantageous in the context of the production of photovoltaic cells and modules.

Currently, photovoltaic cells are predominantly manufactured from monocrystalline or multicrystalline silicon. The commonest chain of production of crystalline silicon employs the solidification of ingots from a bath of liquid silicon. These ingots are then cut into wafers which may be converted into photovoltaic cells.

Multicrystalline silicon ingots are conventionally produced by melting a silicon feedstock, followed by a directional solidification. This technique advantageously makes it possible to crystallize large volumes of silicon; and the size of the ingots manufactured may be adjusted by varying the dimension of the crucibles.

Unfortunately, this highly productive process has a major drawback with regard to the crystalline structure of the silicon ingots thus produced. In fact, this technique results in ingots that have a crystalline structure characterized by a very large number of different crystalline orientations and grains, but also by a high density of dislocations, these dislocations being distributed inhomogeneously in the ingot. Consequently, this process is not effective for obtaining a monocrystalline-like, referred to as "mono-like", silicon ingot, that is to say a silicon ingot consisting very predominantly (especially of more than 90%) of monocrystalline material.

Several years ago, techniques were developed to produce mono-like silicon ingots by directional solidification in a furnace with improved crystalline structures, especially via a better control of the nucleation, as described in the document by Fujiwara et al., Growth of structure-controlled polycrystalline silicon ingots for solar cells by casting, Acta Materialia, 54 (2006), 3191-3197, or else via the use of monocrystalline seeds tiling the bottom of the crucible (technique referred to as seeded regrowth), as proposed in documents WO 2007/084934, US 2010/0192838, US 2010/0193989, US 2010/0193664, WO 2009/014963, US 2010/0197070 and US 2013/0095028.

Unfortunately, the manufacture of a silicon ingot, by seeded regrowth in a directional solidification furnace, poses a problem of reduction in the proportion of crystals derived from seeds with the height of the ingot. This reduction is prejudicial to the quality of the ingot obtained, given that the crystals derived from nucleations at the periphery of the seed zones have an unacceptable amount of crystalline defects for use as photovoltaic cells. In fact, a multicrystalline zone, which develops from the edges of the crucible over the entire height of the ingot, is capable of degrading the quality of the ingot formed from the seeds at the bottom of the crucible.

In order to improve the quality of the ingots produced by seeded regrowth, it is consequently important to increase the proportion of the crystals derived from the seeds.

Several factors may be behind the reduction in the proportion of the crystals derived from the seeds with the height of the ingot: they may especially be linked to the thermodynamics of the furnace, or to the growth of crystalline defects.

The thermodynamics of a directional solidification furnace are characterized by the shape of the advance of the melting and solidification front.

The expression "melting and solidification front" of the furnace, referred to more simply in the remainder of the text as "solidification front" of the furnace, is understood to mean the solid silicon/liquid (or molten) silicon interface during the directional solidification of the silicon in the crucible.

Two main types of furnace thermodynamics exist: furnaces having a convex solidification front and furnaces having a concave solidification front.

A concave, respectively convex, solidification front is such that the solid-liquid interface is located vertically at a higher, respectively lower, altitude at the walls of the crucible than at the center of the crucible, during the directional solidification.

In the case of convex, or even very convex, thermodynamics, the cycle times are long since the solidification of the corners at the end of the cycle is slow (typically from 8 to 9 hours).

A solidification front that is concave, or even close to planarity, makes it possible to eliminate the main drawbacks linked to convex thermodynamics. The thermodynamics with a solidification front that is spatially or temporally concave or close to planarity are the most suitable for the production of ingots by seeded regrowth. A solidification front close to planarity is particularly preferred since it makes it possible to use seeds of minimal thickness in the bottom of the crucible.

Unfortunately, the monocrystalline portion in the silicon solidified at the edge of the walls of the crucible decreases drastically with the height of the ingot. This phenomenon results, on the one hand, from the propagation of parasitic grains coming from the nucleation at the side wall of the crucible or in peripheral zones having no seeds, and on the other hand from the propagation of twinned crystals towards the core of the ingot.

Thus, the twinned crystals and nucleations reduce the monocrystalline proportion of the ingot usable for producing bricks. FIG. 1 illustrates this result for the cutting of a "G5" ingot into 25 bricks. Although the seeds deposited at the bottom of the crucible cover this surface area of future bricks, the surface area that is actually monocrystalline at the top of the ingot is reduced to the internal zone of the outline T, due to the edge effects that develop over the entire height of the ingot during the solidification thereof.

The present invention aims precisely at overcoming the aforementioned drawbacks and optimizing the usable monocrystalline proportion of a silicon ingot obtained by seeded regrowth in a furnace having a solidification front that is spatially or temporally concave or close to planarity.

The present invention thus relates, according to a first of its aspects, to a process for manufacturing a silicon ingot by seeded regrowth in a directional solidification furnace, comprising at least the steps consisting of:

(i) providing a crucible (1) of longitudinal axis (Z), the bottom of which comprises a tiling of monocrystalline silicon seeds (2) of straight prism shape; and (ii) carrying out the directional solidification of silicon by seeded regrowth, in a growth direction collinear to the axis (Z) and with a solidification front that is spatially or temporally concave or close to planarity;

characterized in that the tiling in step (i) is formed:
  from one or more central seeds $G_c$; and
  from one or more peripheral seeds $G_p$, adjacent to the seed(s) $G_c$,
  a seed $G_p$ having a crystal lattice symmetrical to the crystal lattice of the adjacent seed $G_c$, relative to the plane P defined by the boundary (3) between said seeds $G_p$ and $G_c$;
  said seed(s) $G_p$ having, in a vertical cutting plane, a width ($l_p$) strictly smaller than the total width ($l_u$) of said central seed(s); and
  the peripheral seeds $G_p$ being sized so that:

$$l_p = d - b$$

with:
  d satisfying: $d \geq H \cdot \tan \theta_{max}$, wherein $\theta_{max}$ is the maximum value of the angle θ of the solidification front of the furnace used, and H is the desired height, measured along the axis (Z), of the silicon ingot; and
  b=0 for a crucible with right angles, and b= $R_{internal\ crucible}$, wherein $R_{internal\ crucible}$ is the size of the bevel for a crucible with rounded edges.

The expression "spatially or temporally" concave or close to planarity is understood to mean that at a given instance of the progression of the solidification front, or at a given point of the solidification front, the solid/liquid interface is of concave shape or has a shape close to planarity.

In the remainder of the text, and unless otherwise indicated, a seed and/or ingot and/or wafer, defined subsequently, are characterized for the orthogonal frame of reference of axes (x), (y) and (z), corresponding to the three main directions, respectively, of the seed, of the ingot or of the wafer. Preferably, the axis (z) of a seed and/or of an ingot is collinear to the longitudinal axis (Z) of the crucible.

The longitudinal axis (Z) of the crucible denotes the line joining all of the barycenters of the cross sections of said crucible (walls of the crucible included). The longitudinal axis may more particularly be an axis of symmetry for the crucible.

The expression "straight prism shape" is of course understood to mean a shape approximately of straight prism type. In particular, the seeds have side walls that are vertical or substantially vertical (deviation of ±5°). Furthermore, the seeds of the tiling at the bottom of the crucible have approximately planar surfaces, except for surface irregularities.

The overall planar surface of the seed facing the bottom of the crucible will be denoted in the remainder of the text as being the "base of the seed".

As described in detail subsequently, the base of the seeds may be of varied shape, in particular of square or rectangular or else parallelogram shape. Preferably, it is of square or rectangular shape, the seeds being then approximately of straight block shape.

The width "$l_p$" of a peripheral seed corresponds, in a vertical cutting plane, to the distance between two successive walls of said peripheral seed.

Advantageously, the inventors have thus discovered that it is possible to maintain the growth of the monocrystalline zone resulting from the seeds $G_c$ over the entire height of the ingot formed, via the positioning of peripheral seeds $G_p$ sized in a suitable manner as described above.

Indeed, with a tiling of seeds in accordance with the invention, as expanded upon more specifically in the remainder of the text, the multicrystalline zone that is nucleated starting from the walls of the crucible does not interfere with the grain boundary that propagates starting from the interface between seeds $G_p$ and $G_c$. Moreover, the twinned crystals, created from the multicrystalline zone, are stopped at this grain boundary, and cannot therefore propagate freely toward the monocrystalline core of the ingot.

The central monocrystalline zone of the ingot, also referred to in the remainder of the text as the "central ingot", that grows from central seeds, is thus of excellent crystalline quality.

According to another of its aspects, the present invention relates to a silicon ingot, obtained according to the process defined above, having a monocrystalline core separated by grain boundaries, preferably that are substantially vertical, from a peripheral multicrystalline zone.

The invention also relates, according to another of its aspects, to a process for manufacturing a monocrystalline silicon ingot, comprising at least a step (iii) of cutting the ingot as defined above, along planes P defined by the interface between two adjacent seeds $G_c$ and $G_p$, so as to eliminate the multicrystalline zones formed directly above the seeds $G_p$.

Other features, advantages and methods of application of the process and of the silicon ingot obtained according to the invention will emerge more clearly on reading the detailed description which follows, of the exemplary embodiment of the invention and on examining the appended drawings, in which:

FIG. 4 represents, schematically and partially, in cross section, the positioning of a peripheral seed $G_p$ in the case of a right-angled crucible (FIG. 4a) and of a bevelled crucible (FIG. 4b);

FIG. 5 represents, schematically and partially, in cross section, the development of the multicrystalline zone 4 and of the twinned crystals 5 in an ingot formed according to the invention, starting from seeds $G_c$ and $G_p$ having symmetrical crystal lattices;

Figure 6:
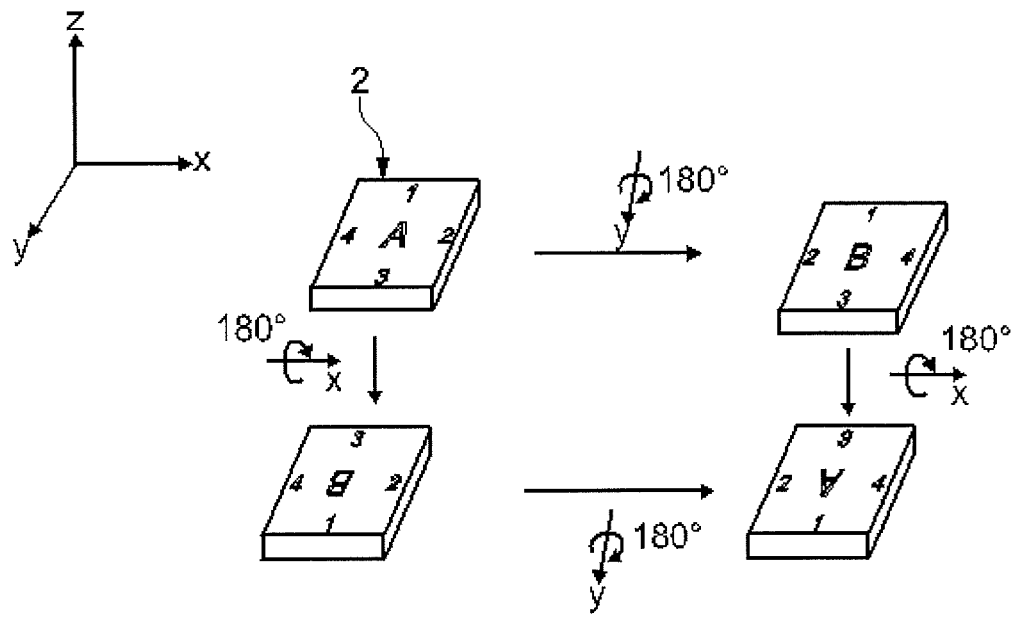
Figure 7:
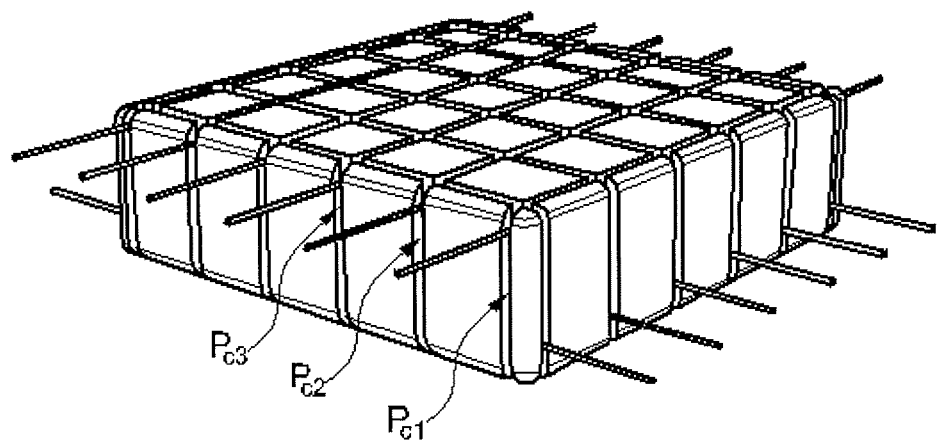

FIG. 6 schematically represents, in 3-D view, the formation of the adjacent seeds by rotation of an angle of 180° (or turning over) about the axis (y) or the axis (x);

FIG. 7 represents, in 3-D view, the production of bricks from a central ingot of monocrystalline silicon 7 along the planes $P_c$ ($P_{c1}$, $P_{c2}$, $P_{c3}$, . . . ).

Figure 8:
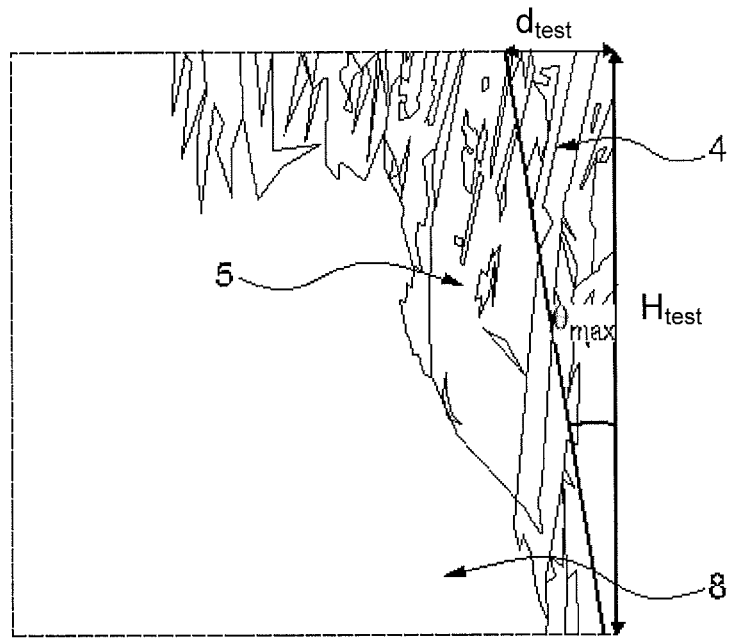

FIG. 8 represents the determination, with the aid of a crystallographic study, of the angle $\theta_{max}$ during the directional solidification test carried out in the example.

Figure 9:
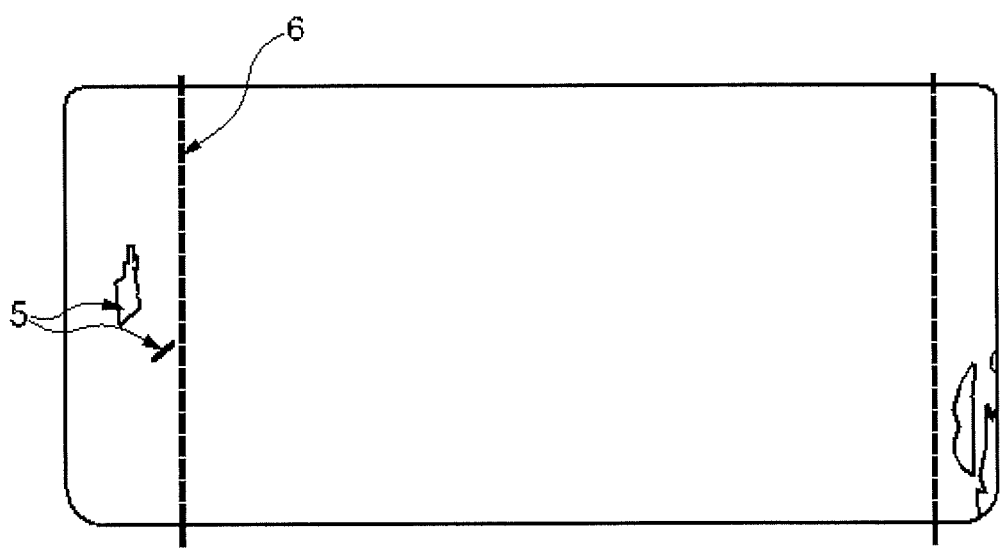
Figure 10:
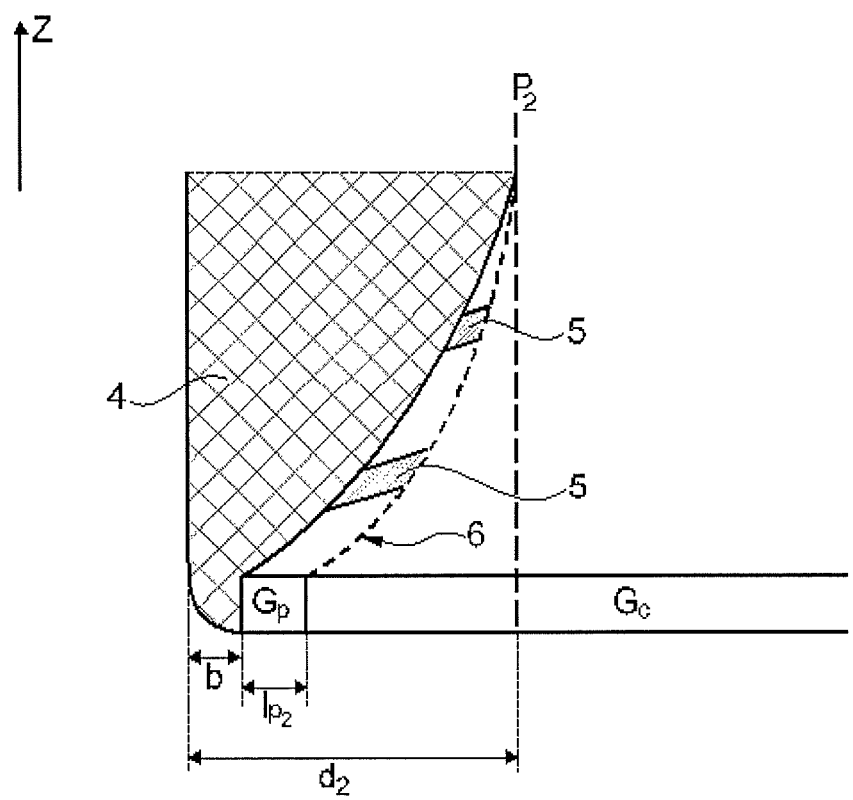

FIG. 9 is a photographic image of a vertical slice of ingot with a 388×180 mm cross section. The conditions for obtaining it are those described in detail in the example; and the structure of the seeds is revealed by the cutting and cleaning operation that results in an optical contrast that varies for each crystalline orientation;

FIG. 10 represents, schematically and partially, in cross section, the development of the multicrystalline zone 4 and of the twinned crystals 5 in an ingot formed by seeded regrowth, starting from seeds $G_c$ and $G_p$ that do not have symmetrical crystal lattices.

It should be noted that, for reasons of clarity, the various elements in the figures are not drawn to scale, the actual dimensions of the various parts not being observed.

In the remainder of the text, the expressions "between . . . and . . . ", "ranging from . . . to . . . " and "varying from . . . to . . . " are equivalent and are intended to signify that the limits are included, unless otherwise mentioned.

Unless otherwise mentioned, the expression "containing/ comprising a" should be understood to be "containing/ comprising at least one".

Tiling in the Bottom of the Crucible (Step (i))

As specified above, the process of the invention uses a tiling, in the bottom of the crucible, by seeds 2 of monocrystalline silicon of straight prism shape.

The tiling of seeds 2 may be formed in the bottom of a conventional crucible. It is also possible to envisage crucibles, of which the bottom itself is formed of the tiling of seeds.

According to one particular preferred embodiment, the seeds 2 are of square- or rectangular-based straight block shape.

According to one essential feature of the invention, the tiling of seeds 2 is formed:

from one or more central seeds, denoted by $G_c$; and
from one or more peripheral seeds, denoted by $G_p$, adjacent to the seed(s) $G_c$.

Sizing of the Peripheral Seeds

Figure 1:
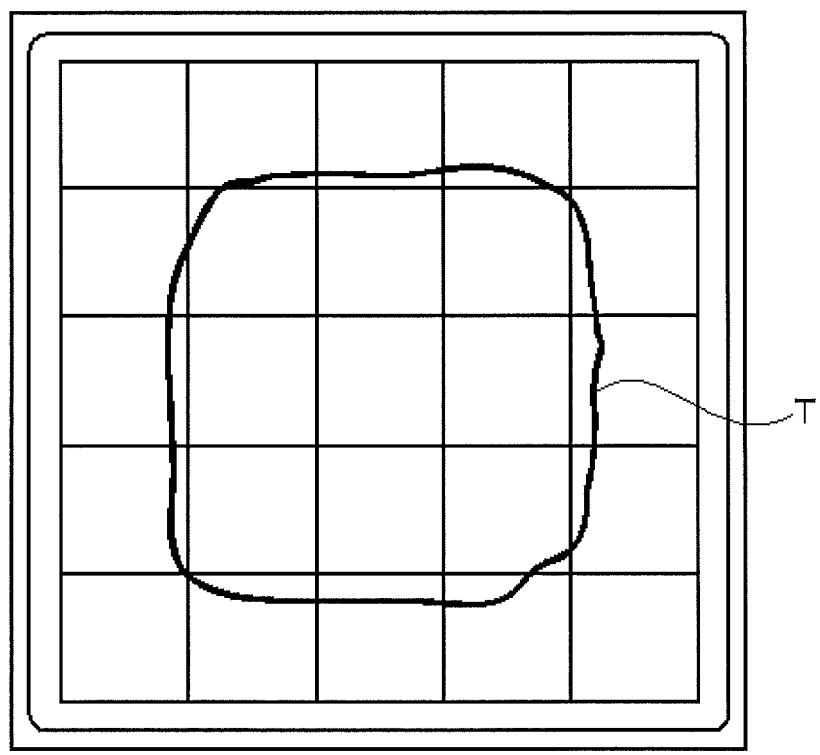
FIG. 1 represents, schematically and as a top view, the monocrystalline surface, delimited externally by the outline T, at the top of the ingot, for a conventional solidification by seeded regrowth of a G5 ingot.
Figure 2A:
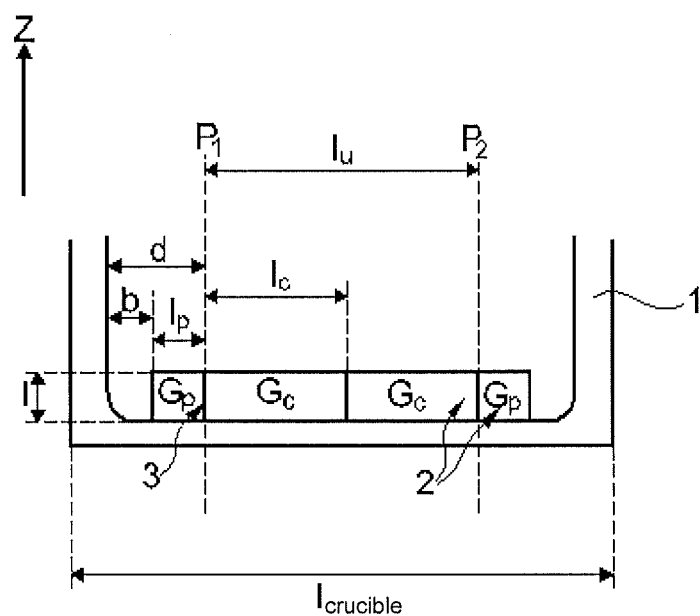
FIG. 2 represents, schematically and partially, a tiling at the bottom of the crucible in accordance with the invention using seeds $G_c$ and $G_p$, in cross section (FIG. 2a) and as a top view (FIG. 2b)

As represented in FIG. 2a, a seed $G_p$ according to the invention is sized so that the width (denoted by $l_p$) of the peripheral seed in a vertical cutting plane satisfies:

$$l_p = d - b;$$

with:

d being such that $d \geq H \cdot \tan \theta_{max}$, wherein $\theta_{max}$ is the maximum value of the angle $\theta$ of the solidification front of the furnace used, and H is the height desired for the ingot; and b=0 for a crucible with right angles, and b= $R_{internal\ crucible}$, wherein $R_{internal\ crucible}$ is the size of the bevel for a crucible with rounded edges.

d represents more particularly the spacing, in a vertical cutting plane, between the interface 3 between a peripheral seed $G_p$ and a central seed $G_c$ which are adjacent, and the closest side wall of the crucible.

In order to define the width $l_p$ of a peripheral seed $G_p$, it is necessary to firstly determine the distance d. This is chosen such that $d \geq H \cdot \tan \theta_{max}$.

Conventionally, the height H, measured along the growth axis Z, of the ingot may be chosen to be greater than or equal to 100 mm, in particular between 180 and 800 mm.

The value $\theta_{max}$ may be for example determined at the end of a test of directional solidification, carried out in the same crucible 1, of a silicon ingot having a height $H_{test}$ similar to the height H of the desired ingot, obtained by seeded regrowth.

The directional solidification test, with a view to determining the angle $\theta_{max}$, may for example be carried out by tiling the bottom of the crucible with Cz seeds, in other words with seeds derived from a silicon ingot produced according to a Czochralski pulling technique (also referred to as a "Cz" ingot), or by tiling the bottom of the crucible with "Fz" seeds, in other words with seeds derived from an ingot produced according to a float zone process, also referred to as an "Fz" process.

It is up to a person skilled in the art to determine, by conventional methods, the value $\theta_{max}$ from the solidification test carried out.

Figure 3A:
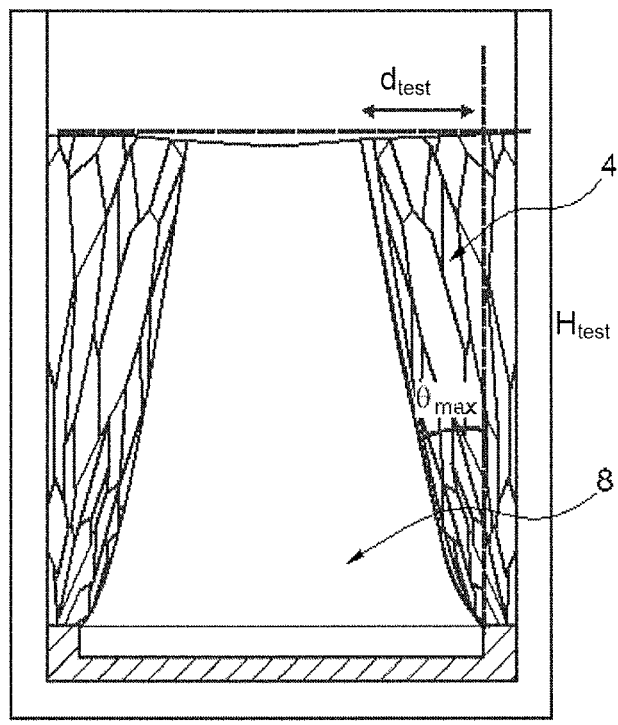
FIG. 3 represents, schematically, the determination of the solidification front using a crystallographic method (FIG. 3a) or using resistivity mapping (FIG. 3b)

As illustrated in FIG. 3a, the value $\theta_{max}$ may be determined using a crystallographic method, by observing the change in structure between the monocrystalline zone 8 and the multicrystalline zone 4 at the top of the ingot formed of height $H_{test}$, which gives information regarding the deviation of the multicrystalline zone from the bottom to the top of the ingot.

The value $\theta_{max}$ may thus be calculated, at the end of the directional solidification test, by the following formula: $\tan \theta_{max} = d_{test}/H_{test}$, with $d_{test}$ being the distance furthest away from the edge of the crucible where the multicrystalline zone lies for the ingot of height $H_{test}$ obtained during the test, as represented schematically in FIG. 3a.

Other methods of determining the angle $\theta_{max}$ may be used. By way of example, it may be determined using resistivity mapping during a test of directional solidification of a silicon ingot with boron doping.

Figure 3B:
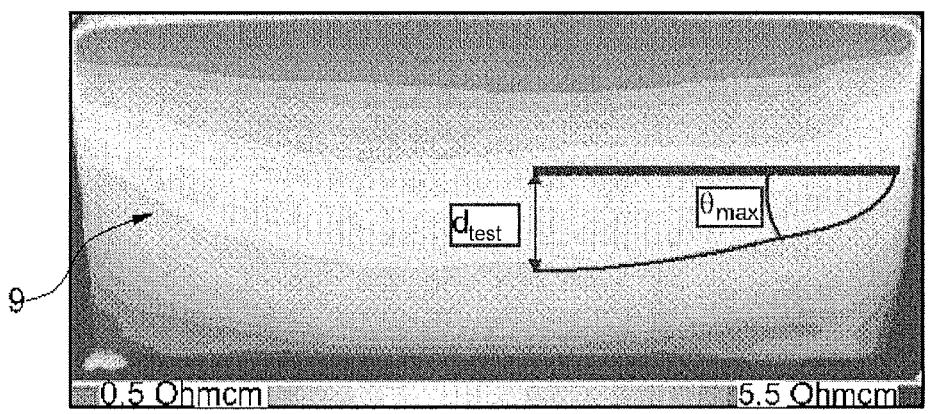

In fact, boron, having a partition coefficient k=0.8 partitions uniformly in the volume of the ingot during the solidification. This results in a local variation of the resistivity of the ingot, which follows the development of the solid-liquid interface during the crystallization of the silicon. An isoresistivity line 9 observed on the resistivity mapping thus corresponds to the solidification front at a given instant. The angle of the solidification front $\theta_{max}$ may therefore be directly measured on the isoresistivity curves defined on the resistivity mapping, as represented schematically in FIG. 3b.

According to one preferred embodiment, d is chosen to be equal to $H \cdot \tan \theta_{max}$, so as to optimize the total width ($l_u$) of the central ingot obtained.

Said seed(s) $G_p$ may have, in a vertical cutting plane, a width $l_p$ of less than or equal to 157 mm, in particular of between 5 and 40 mm.

In a first embodiment variant, the crucible used may be a right-angled crucible (in other words, b=0). As represented in FIG. 4a, the seed $G_p$ may, in this case, be placed next to the side wall 1 of the crucible.

Within the context of this variant, a seed $G_p$ has a width $l_p = d$, d being as defined above, preferably $d = H \cdot \tan \theta_{max}$.

In a second embodiment variant, the crucible used may be a crucible with rounded edges, also referred to as a bevelled crucible. As represented in FIG. 4b, the seed $G_p$ may, in this case, be spaced away from the side wall 1 of the crucible by a distance b equal to the size of the bevel of the crucible $R_{internal\ crucible}$ (typically between 2 and 40 mm).

Within the context of this variant, a seed $G_p$ has a width $l_p = d - b$, with d being as defined above, preferably $d = H \cdot \tan \theta_{max}$.

As represented in FIG. 5, the peripheral seed $G_p$ thus sized advantageously enables the multicrystalline zone 4, which propagates from the wall of the crucible, to have no interference with the grain boundary 6 created from the interface 3 between $G_p$ and $G_c$.

Thus, owing to the use of peripheral seeds according to the invention, the nucleations on the walls of the crucible do not lead to a reduction in the proportion of monocrystalline zone derived from the seeds $G_c$ over the height of the ingot.

The dimensions other than the width $l_p$ of a peripheral seed may be chosen independently of the thermodynamics of the furnace.

According to one particular embodiment, a seed $G_p$ may have a thickness e along the axis Z, of greater than or equal to 5 mm. By way of example, it may be around 20 mm.

Preferably, the peripheral seeds have a thickness similar, or even identical, to that of the central seed(s).

Figure 2B:
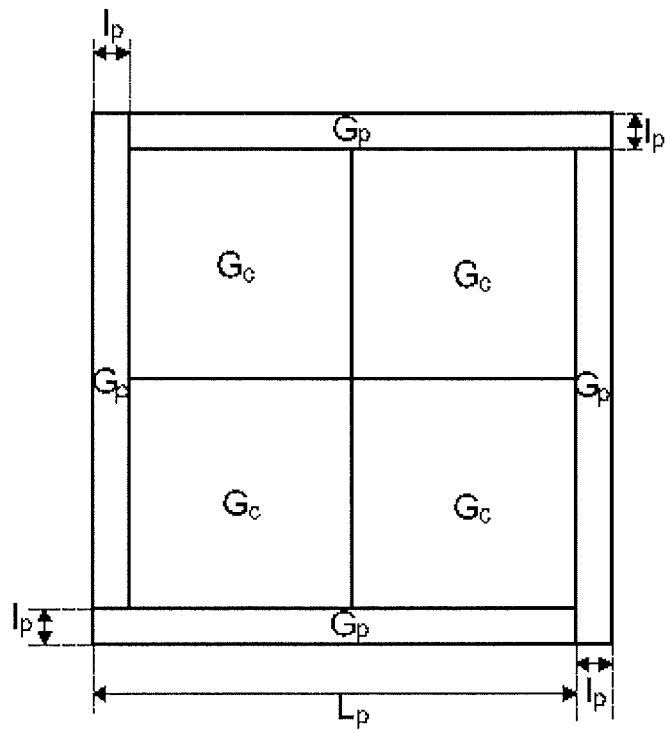

According to one particular preferred embodiment, the seeds $G_p$ are of straight block shape, of width $l_p$ and of length $L_p$ chosen so that a single type of seed $G_p$ is necessary for tiling along the side of the crucible, as represented for example in FIG. 2b.

The central tiling may be formed from one or more central seeds $G_c$.

The term "$l_u$" (for "effective width" ["largeur utile" in French]) will denote the total width, in a vertical cutting plane, of the central seeds. $l_u$ more particularly satisfies $l_u = l_{crucible} - 2d$, with $l_{crucible}$ being the width of the crucible, in the cutting plane, and d being as defined above.

Said seed(s) $G_c$ may thus have, in a vertical cutting plane, a width $l_c$ of less than or equal to $l_u$, in particular of between 110 mm and $l_u/n$ with n being the number of central seeds placed side-by-side, it being possible in particular for n to be between 1 and 10.

The central seeds are preferably of square- or rectangular-based straight block shape. Such seeds advantageously enable a central tiling in the bottom of the crucible in the form of a regular grid. As explained in detail in the remainder of the text, such tiling proves advantageous, within the context of forming symmetrical grain boundaries in the central ingot, in particular for producing bricks from the ingot formed at the end of the process of the invention.

According to a first embodiment variant, the central tiling is produced using seeds $G_c$ of square-based straight block shape, as represented in FIG. 2b, for example having a side ($l_a$) of a square of between 110 mm and $l_u/n$, with $l_u$ and n as defined above, in particular having a side $l_c$ of a square of greater than or equal to 95 mm.

By way of example, FIG. 2b represents a central tiling in square shape, referred to as "G2", formed from 4 central seeds of square-based straight block shape.

According to a second embodiment variant, the central tiling is produced using seeds $G_c$ of rectangular-based straight block shape, for example having a width of a rectangle of between 110 mm and $l_u/n$, in particular having a width of greater than or equal to 95 mm and having a length greater than or equal to two times the width.

The seeds $G_c$ may have a thickness along the axis Z of greater than or equal to 5 mm. Preferably, all of the seeds $G_c$ forming the tiling at the bottom of the crucible have the same thickness (e) along the axis Z.

As mentioned previously, in one particularly preferred embodiment, the central and peripheral seeds have similar, or even identical, thicknesses.

The seeds $G_c$ and $G_p$ of monocrystalline silicon used for the tiling according to the invention may be derived from a silicon ingot produced according to a Czochralski pulling technique (also referred to as a "Cz" ingot), in which technique a silicon crystal is placed in contact with a bath of molten silicon, in order to grow a monocrystalline ingot.

This method generally provides Cz ingots of cylindrical shape. They may be machined, in a conventional manner, and cut into slices perpendicular or parallel to the axis of the cylinder, in order to obtain seeds of straight block shape.

According to another embodiment variant, the seeds $G_c$ and $G_p$ of monocrystalline silicon originate from the recycling of an ingot produced during a previous directional solidification according to the process of the invention, for example by removing a horizontal slice of the silicon ingot formed.

As indicated above, a seed $G_c$ advantageously has a crystal lattice symmetrical to the crystal lattice of the seed $G_p$ which is adjacent thereto, relative to the plane P defined by the seed boundary 3 between said seeds $G_p$ and $G_c$.

Such a symmetry of the crystal lattices of the seeds $G_c$ and $G_p$ enables, during step (ii) of directional solidification of silicon, the propagation of symmetrical grain boundaries 6 from the seed boundaries 3, as represented schematically in FIG. 5.

The expression "symmetrical grain boundaries" is understood to denote a flat grain boundary, present in the silicon ingot formed at the end of the directional solidification of silicon, and defining a plane of crystalline symmetry P for the crystal lattices located on either side of this plane.

As represented schematically in FIG. 5 and illustrated in example 1 (FIG. 10), the grain boundary 6 advantageously makes it possible to block the propagation of the twinned crystals 5 created from the multicrystalline zone at the edge of the crucible.

According to one particular embodiment variant, the central tiling may also be formed from seeds $G_c$ having crystal lattices that are symmetrical to one another; in other words each seed $G_c$ has a crystal lattice symmetrical to the crystal lattice of the seed $G_c$ which is adjacent thereto, relative to the plane defined by the boundary between the two adjacent seeds $G_c$.

This embodiment proves particular advantageous for controlling the propagation of the grain boundaries in the monocrystalline central ingot formed.

In a first embodiment, a peripheral seed $G_p$ may have orientations along the directions (x), (y) and (z), that are identical, except for the cutting and positioning uncertainties in the bottom of the crucible, to those of the central seed $G_c$ which is adjacent thereto.

By way of example, the seeds $G_c$ and $G_p$ may be removed from a same Cz ingot, for example by cutting the $C_z$ ingot perpendicular to the direction of growth of the crystal used in the Czochralski process.

In a second embodiment, the peripheral seed $G_p$ and the central seed $G_c$ may have different crystallographic orientations. Preferably, the disorientation, as defined below, between the seeds $G_p$ and $G_c$ takes place about a disorientation axis parallel to the axis (z). In other words, the seeds $G_c$ and $G_p$ have different crystalline orientations along the directions (x) and (y).

Generally, the difference in orientation between the crystal lattices of two seeds 2 is referred to as "disorientation". This disorientation is expressed by a rotational operation about a disorientation axis <u v w> and having a disorientation angle 2φ. Subsequently, "total disorientation" will refer to the smallest disorientation angle 2φ among all the aforementioned rotational operations; and the "disorientation axis" will refer to the axis associated with this angle.

Preferably, the total disorientation 2φ between the symmetrical crystal lattices of two adjacent seeds (2), denoted by "seed A" and "seed B" in order to differentiate them (whether they are two adjacent seeds $G_p$ and $G_c$ or, in the aforementioned variant, two adjacent seeds $G_c$) is greater than or equal to 4°, in particular greater than or equal to 5°, and more particularly between 6° and 45°.

According to one particular embodiment, the crystal lattices of two adjacent symmetrical seeds 2 both have a direction collinear to the axis (Z), preferably a direction <100> or close to <100> collinear to the axis (Z), each of the seeds advantageously being disoriented along a same angle θ relative to this direction along (x) and/or (y).

The disorientation θ of a seed may be determined by measurement methods known to a person skilled in the art, for example by measurement of the angles with the Laue method, by x-ray diffraction, or else by electron backscattered diffraction (EBSD).

However, advantageously, it is possible to avoid measuring the disorientation angles θ of each of the seeds used, by producing the tiling of adjacent seeds having crystal lattices symmetrical to one another, from seeds of a single type.

Thus, according to one particular embodiment, the tiling in the bottom of the crucible by adjacent seeds 2, denoted by seed A and seed B, having crystal lattices symmetrical to one another, may be produced using identical silicon seeds, the seed B being obtained from a seed A that has undergone a rotation of an angle of 180° about one of the vectors perpendicular to the side faces of the seed, that is to say, within the context of a tiling in the form of a grid, about the axis (x) or (y).

By way of example, FIG. 6 represents the obtaining of seeds A and B of straight block type, the seed B being obtained by rotation of an angle of 180° about the axis x and/or the axis (y).

According to one preferred embodiment, in the case of the use of seeds $G_c$ having crystal lattices symmetrical to one another, the disorientation between the crystal lattices of two adjacent seeds $G_c$ takes place about an axis <001>. Preferably, the axis <001> is coincident with the axis (Z) of the crucible and/or with the axis (z) of the seed.

Such an embodiment proves particular advantageous, with regard to the wafers that will be formed by cutting the monocrystalline central ingot obtained from such a central tiling of seeds.

In fact, the surfaces of the wafers resulting from cutting the bricks perpendicular to the surface of the central ingot, along the vertical grain boundary planes are, except for the cutting irregularities, substantially parallel to the planes (001). Being of (001) orientation, the surfaces of the wafers thus formed have the feature of being effectively textured by a basic texturing (based on KOH or NaOH for example). This may result in a relative gain in reflectivity of around 5 to 12% at the surface, compared to basic texturings on other orientations or to acid texturings on any orientation.

According to one particular embodiment, the crucible may advantageously be sized as a function of the width $l_p$ of the peripheral seeds $G_p$, previously determined as described above, and of the desired width $l_u$ of the central ingot.

In other words, the width of the crucible, $l_{crucible}$, is chosen such that $l_{crucible} = l_u + 2l_p + 2b$, with b as defined above.

Directional Solidification by Seeded Regrowth (Step (ii))

In a second step of the process of the invention, the directional solidification of silicon is carried out in a furnace by seeded regrowth along a growth direction collinear to the axis (Z) and with a solidification front that is spatially or temporally concave or close to planarity.

A person skilled in the art is able to adjust the operating conditions for the production of the silicon ingot by directional solidification.

The furnace used may be a conventional directional solidification furnace, such as for example a crystallization furnace of HEM (Heat Exchange Method) type or of Bridgman type with set heating at the top and the sides, which makes it possible to crystallize the silicon feedstock with a controlled temperature gradient.

Generally, the directional solidification is carried out by firstly melting a silicon feedstock in the crucible prepared in step (i). When the silicon is completely melted, and when the seeds begin to melt, the molten silicon is solidified, in a directional manner, at low speed (typically from 5 to 30 mm/h).

The directional solidification may be carried out by displacement of the heating system and/or by controlled cooling, enabling a gradual displacement of the solidification front (separation front between the solid phase and the liquid phase) toward the top of the crucible.

The ingot, of height H, obtained at the end of the directional solidification may then be cooled, in particular to ambient temperature (20° C.±5° C.).

As represented schematically and partially in FIG. 5, the silicon ingot obtained according to the process of the invention has a monocrystalline core 7 separated from peripheral multicrystalline zones 4 by grain boundaries 6 that develop from the seed boundaries 3 between peripheral seeds $G_p$ and central seeds $G_c$.

Formation of the Monocrystalline Ingot (Step (iii))

The monocrystalline central ingot 7 may be separated from the multicrystalline zones formed directly above the seeds $G_p$, by cutting the ingot along the planes P defined by the interface between two adjacent seeds $G_e$ and $G_p$.

The positions for cutting the ingot are easily identifiable on the ingot, insofar as they lie at the boundaries between seeds $G_p$ and $G_c$ covering the bottom of the crucible.

The cutting along the planes P may be carried out by conventional means, known to person skilled in the art, for example with the aid of a cutting wire.

The monocrystalline ingot 7 thus obtained is of excellent crystalline quality.

In particular, it may have a multicrystalline part of less than 5% of its total volume.

Silicon Wafers

The monocrystalline silicon ingot 7, obtained at the end of step (iii), may then be cut into bricks.

Silicon wafers may be produced from these bricks, according to conventional techniques known to a person skilled in the art, especially by cutting of the bricks, rectification of the faces, trimming of the top and bottom ends in order to adjust the dimensions of the wafer, etc.

Within the context of the embodiment variant where the seeds $G_c$ used have crystal lattices that are symmetrical to one another, the monocrystalline central ingot advantageously has symmetrical grain boundaries along the planes $(P_{c1}, P_{c2}, P_{c3} \ldots)$ defined by the boundaries between the seeds $G_c$.

According to a first embodiment variant, the cutting of the core ingot into bricks may be carried out independently of the position of the grain boundary planes $P_{c1}, P_{c2}, P_{c3} \ldots$. The resulting bricks thus contain symmetrical grain boundaries.

According to a second embodiment variant, the cutting of the core ingot into bricks may be carried out along the planes $P_{c1}, P_{c2}, P_{c3}, \ldots$, as represented schematically in FIG. 7.

Cutting the silicon ingot along these planes thus makes it possible to eliminate the symmetrical grain boundaries and to advantageously obtain bricks free of grain boundaries. The positions for cutting the central ingot along the symmetrical grain boundaries are easily identifiable on the the ingot, insofar as they lie at the boundaries between adjacent seeds $G_c$ covering the bottom of the crucible.

For a grid-type tiling of seeds $G_c$ as represented schematically in FIG. 2b, the cutting may for example be carried out using a conventional machine of "squarer" or bandsaw type.

It is up to a person skilled in the art to adapt the pitch of the wire guide, with regard to the size of the tiling seeds $G_c$ used and the diameter of the cutting wires used, so that the cutting with the squarer takes place along each of the planes $P_{c1}, P_{c2}, \ldots$ and makes it possible to eliminate the symmetrical grain boundaries of the central ingot.

The wafers thus obtained may advantageously be used for producing photovoltaic cells, for example for homojunction or heterojunction systems.

Other embodiment variants of the tiling at the bottom of the crucible by central and peripheral seeds may be envisaged, without departing from the spirit of the invention.

Thus, according to another embodiment variant, the process of the invention uses in step (i) a tiling with seeds $G_c$ and $G_p$ that do not have crystal lattices that are symmetrical to one another.

Within the context of this variant, the tiling in step (i) at the bottom of the crucible may be formed:
- from one or more central seeds $G_c$; and
- from one or more peripheral seeds $G_{p2}$, adjacent to the seed(s) $G_c$;

the seeds $G_{p2}$ having, in a vertical cutting plane, a width $l_{p2}$ strictly smaller than the width $l_c$ of a central seed $G_c$; and being sized so that:

$$0 < l_{p2} < d_2 - b,$$

with:
- $d_2$, representing the distance separating the wall of the crucible from the multicrystalline/monocrystalline zone interface at the top of the ingot of height H, satisfying: $d_2 = H \cdot \tan \theta_{max}$, with $\theta_{max}$ the maximum value of the angle $\theta$ of the solidification front of the furnace used, and H being the desired height, measured along the axis (Z), of the silicon ingot; and
- b=0 for a crucible with right angles, and b= $R_{internal\ crucible}$, with $R_{internal\ crucible}$ the size of the bevel for a crucible with rounded edges.

The value $\theta_{max}$ may more particularly be determined by a prior directional solidification test, as described above.

In one such embodiment variant, as represented schematically in FIG. 10, the grain boundaries 6 that propagate during the step of directional solidification of the ingot, from seed boundaries between peripheral seeds $G_{p2}$ and central seeds $G_c$, are not symmetrical grain boundaries.

Nevertheless, they make it possible to effectively stop the propagation of the twinned crystals 5 created from the multicrystalline zone 4.

A monocrystalline ingot, of excellent crystalline quality, may thus be obtained by cutting the ingot obtained at the end of the directional solidification step (ii), along the planes $P_2$ parallel to the sidewalls of the crucible, at a distance $d_2$ from the wall of the crucible, as represented in FIG. 10.

In the case of a solidification front that is close to planarity at the end of the solidification of the ingot, the grain boundary 6 that propagates from the seed boundaries between $G_p$ and $G_c$ acquires a near verticality at the top of the ingot. The cutting positions for the core ingot are easily identifiable, insofar as they lie at the boundaries between seeds $G_p$ and central seeds $G_c$.

The invention will now be described by means of the following example given of course by way of nonlimiting illustration of the invention.

EXAMPLES

1. Determination of the Maximum Value of the Angle θ of the Solidification Front of the Furnace The crystallization furnace used for the seeded regrowth tests is a furnace of "Gen 2" size (60 to 80 kg of feedstock) having three heating zones that are controlled in terms of temperature or power: a top heating zone, a bottom heating zone and a side heating zone.

The crucible used for this test is a crucible made of silica coated with $Si_3N_4$ of G2 size (390×390 $mm^2$).

A multicrystalline ingot is produced in the crucible, according to a specific thermal recipe developed for obtaining a multicrystalline ingot that satisfies the quality criteria of standard bricks.

This type of crucible is surrounded by a graphite crucible support that is used to limit the expansion of the silicon which, during the rise in temperature in the course of the cycle and the associated glass transition, becomes viscous.

The feedstock consists of a mass of electronic grade silicon (9N) or metallurgical grade silicon (6N) that is larger or smaller depending on the desired ingot size, the amount of dopant, whether it is of P type (boron) or N type (phosphorus), is calculated as a function of the resistivity and of the type desired.

After the experiment, the silicon ingot is cut along a vertical cutting plane, in order to determine the solidification front of the furnace using a metallographic or resistivity study.

Using a crystallographic study (as represented schematically in FIG. 8), it is possible to easily determine the various dimensions necessary:

$H_{test} = 180$ mm $\theta_{max} = 10.7°$ and: $d_{test} = H_{test} \cdot \tan \theta_{max}$ $d_{test} = 34$ mm In view of the angle $\theta_{max}$ (10.7° of the solidification front of the furnace used, and the size of the bevel present for this crucible (b=14 mm), the peripheral seeds must have a minimum width of 20 mm.

2. Manufacture of the Silicon Ingot 2.i. Production of the Tiling of Seeds $G_c$ and $G_p$ A tiling of the bottom of the crucible (crucible and crucible support identical to those used in the previous test) is produced, as were presented schematically in FIG. 2b, with:
- in the central zone, four seeds $G_c$ of Cz type having dimensions of 144×144 mm and a thickness of 20 mm. These seeds are cut from an ingot having a diameter of 8 inches (202 mm) perpendicular to the growth direction of the crystal. The seeded regrowth will therefore have a growth identical to the growth direction of the Cz seed: close to <100>; and
- in the peripheral zone in the vicinity of the walls of the crucible and adjacent to the seeds $G_c$, four peripheral seeds $G_p$ having dimensions of 28×317 mm and a thickness of 20 mm. The seeds were removed from a same Cz ingot and have orientations, along the three directions, similar to the central seeds.

The seeds were cleaned ultrasonically in a bath of acetone and a bath of ethanol for a duration of 30 minutes and then etched in a 10 wt % sodium hydroxide solution.

The features of the seeds used are presented in table 1 below.

TABLE 1

| | Characterization of the seeds $G_c$ and $G_p$ | | |
|---|---|---|---|
| No. | Dimensions (mm) Width × length × thickness | type | Resistivity (Ω · cm) |
| $G_c$ 1 | 144 × 144 × 20 | P | 1.3 |
| $G_c$ 2 | 144 × 144 × 20 | P | 1.4 |
| $G_c$ 3 | 144 × 144 × 20 | P | 1.5 |
| $G_c$ 4 | 144 × 144 × 20 | P | 1.7 |

TABLE 1-continued

Characterization of the seeds $G_c$ and $G_p$

| No. | Dimensions (mm) Width × length × thickness | type | Resistivity ($\Omega \cdot cm$) |
|---|---|---|---|
| $G_p$ 1 | 28 × 317 × 20 | P | 1.5 to 1.7 |
| $G_p$ 2 | 28 × 317 × 20 | P | 1.5 to 1.7 |
| $G_p$ 3 | 28 × 317 × 20 | P | 1.5 to 1.7 |
| $G_p$ 4 | 28 × 317 × 20 | P | 1.3 to 1.5 |

2.ii. Directional Solidification of Silicon by Seeded Regrowth in the Furnace

The directional solidification of a silicon feedstock, identical to that used for determining the maximum value of the angle θ of the solidification front of the furnace (point 1.) is carried out.

Results

On leaving the furnace, observation of the upper face of the ingot indicates the presence of a monocrystalline zone, a first indication regarding the monocrystalline growth from bottom to top of the ingot.

Observation of the crystalline structure post-cutting (photograph (180 mm×388 mm) presented in FIG. 9) demonstrates that the growth of the monocrystalline zone resulting from the central seeds is maintained over the entire height of the ingot. It may be observed that the twinned crystals 5, created from the multicrystalline zone, are blocked on the outsides of the ingot with the aid of grain boundaries 6 created by the interfaces between peripheral seeds and central seeds.

The invention claimed is:

1. A process for manufacturing a silicon ingot by seeded regrowth in a directional solidification furnace, comprising at least the steps consisting of:
   (i) providing a crucible of longitudinal axis (Z), the bottom of which comprises a tiling of monocrystalline silicon seeds of straight prism shape; and
   (ii) carrying out the directional solidification of silicon by seeded regrowth, in a growth direction collinear to the axis (Z) and with a spatially or temporally concave solidification front;
wherein the tiling in step (i) is formed:
   from one or more central seeds $G_c$; and
   from one or more peripheral seeds $G_p$, adjacent to the seed(s) $G_c$,
   a seed Gp having a crystal lattice symmetrical to the crystal lattice of the adjacent seed $G_c$, relative to the plane P defined by the boundary between said seeds $G_p$ and Gc;
   said seed(s) $G_p$ having, in a vertical cutting plane, a width ($l_p$) strictly smaller than the total width ($l_u$) of said central seed(s); and
   the peripheral seeds $G_p$ being sized so that:

$l_p = d - b$ with:
   d satisfying: $d \geq H \cdot \tan \theta_{max}$, wherein $\theta_{max}$ is the maximum value of the angle θ of the solidification front of the furnace used, and H is the desired height, measured along the axis (Z), of the silicon ingot; and
   b=0 for a crucible with right angles, and b=$R_{internal}$ crucible, wherein $R_{internal}$ crucible is the size of the bevel for a crucible with rounded edges.

2. The process as claimed in claim 1, wherein the value $\theta_{max}$ is determined at the end of a directional solidification test, in the same crucible, of a silicon ingot having a height $H_{test}$ similar to the height H of the desired ingot, obtained by seeded regrowth.

3. The process as claimed in claim 2, wherein the value $\theta_{max}$ is calculated, at the end of the directional solidification test, by the following formula: $\tan \theta_{max} = d_{test}/H_{test}$, wherein $d_{test}$ is the distance furthest away from the edge of the crucible where the multicrystalline zone lies for the ingot of height $H_{test}$ obtained during the test.

4. The process as claimed in claim 1, wherein the seeds $G_c$ and $G_p$ are derived from a $C_z$ silicon ingot; or from the recycling of an ingot produced during a previous directional solidification by removing a horizontal slice of the ingot formed.

5. The process as claimed in claim 1, wherein the seeds $G_c$ and $G_p$ have a thickness (e) along the axis (Z) of greater than or equal to 5 mm.

6. The process as claimed in claim 1, wherein said seed(s) $G_p$ have, in a vertical cutting plane, a width ($l_p$) of less than or equal to 157 mm.

7. The process as claimed in claim 1, wherein said seed(s) $G_c$ have, in a vertical cutting plane, a width ($l_c$) of between 110 mm and $l_u/n$ wherein n is the number of central seeds placed side-by-side.

8. The process as claimed in claim 1, wherein the seeds $G_c$ have the shape of a square- or rectangular-based straight block.

9. The process as claimed in claim 1, wherein the crucible has right angles, the seed $G_p$ being placed next to the side wall of the crucible.

10. The process as claimed in claim 1, wherein the crucible has rounded edges, the seed $G_p$ being spaced away from the side wall of the crucible by a distance (b) equal to the size of the bevel of the crucible $R_{internal}$ crucible.

11. The process as claimed in claim 1, wherein the crucible is sized as a function of the previously determined width ($l_p$) of the peripheral seeds and of the desired width ($l_u$).

12. The process as claimed in claim 1, wherein each seed $G_c$ has a crystal lattice symmetrical to the crystal lattice of the seed $G_c$ which is adjacent thereto, relative to the plane defined by the boundary between the two adjacent seeds $G_c$.

13. The process as claimed in claim 1, wherein a peripheral seed $G_p$ has a crystallographic orientation different from the adjacent central seed $G_c$.

14. The process as claimed in any one of the preceding claims, wherein the total disorientation 2φ between the symmetrical crystal lattices of a seed $G_p$ and of an adjacent seed $G_c$ is greater than or equal to 4°.

15. A silicon ingot, having a monocrystalline core separated by substantially vertical grain boundaries from a peripheral multicrystalline zone, obtained as claimed in the process of claim 1.

16. A process for manufacturing a monocrystalline silicon ingot, comprising at least a step (iii) of cutting the ingot as defined in claim 15, along planes P defined by the interface between two adjacent seeds $G_c$ and $G_p$, so as to eliminate the multicrystalline zones formed directly above the seeds $G_p$.

17. The process as claimed in claim 16, wherein the monocrystalline silicon ingot isolated at the end of step (iii) has a multicrystalline part of less than 5% of its total volume.

* * * * *